United States Patent [19]

Levine et al.

[11] Patent Number: 5,371,682
[45] Date of Patent: Dec. 6, 1994

[54] METHOD AND APPARATUS FOR PREDICTING BATTERY RESERVE TIME TO A SPECIFIED END-VOLTAGE

[75] Inventors: David E. Levine, Dallas; Arun K. Pasrija, Richardson, both of Tex.

[73] Assignee: AT&T Corp., Murray Hill, N.J.

[21] Appl. No.: 13,272

[22] Filed: Feb. 4, 1993

[51] Int. Cl.⁵ ............................................. G01N 27/46
[52] U.S. Cl. ..................................... 364/483; 320/48; 324/426; 324/427; 324/434
[58] Field of Search ................... 364/483, 481, 550; 324/426, 427, 428, 430, 431, 433, 434; 320/48; 340/636

[56] References Cited

U.S. PATENT DOCUMENTS

| | | | |
|---|---|---|---|
| 3,886,442 | 5/1975 | Chiku | 324/29.5 |
| 4,380,726 | 4/1983 | Sado | 320/48 |
| 4,433,278 | 2/1984 | Lowndes | 320/48 |
| 4,558,281 | 12/1985 | Codd et al. | 324/433 |
| 4,595,880 | 6/1986 | Patil | 364/483 |
| 4,876,512 | 10/1989 | Brilmyer | 324/427 |
| 4,952,862 | 8/1990 | Biagetti et al. | 320/48 |
| 5,187,424 | 2/1993 | Benz et al. | 320/48 |
| 5,218,288 | 6/1993 | Mickal et al. | 320/48 |
| 5,278,509 | 1/1994 | Haynes et al. | 324/427 |

Primary Examiner—Thomas G. Black
Assistant Examiner—Tyrone V. Walker
Attorney, Agent, or Firm—Alfred G. Steinmentz

[57] ABSTRACT

A reserve time predictive system for predicting the capacity of a discharging battery monitors the instant voltage of a battery, its discharge rate and a slope of the voltage vs ampere-hours removed from the battery. The discharge profile of battery voltage vs ampere-hours removed, and the difference between the present and end voltage and the slope of voltage vs ampere-hours remaining is utilized to determine a prediction of reserve time remaining until the battery discharges to the specified end voltage. A combination of remaining reserve time and the measurement of capacity removed also determines the available capacity of the battery from a fully charged state. This information is used as historical data for use in subsequent predictions of battery capacity.

6 Claims, 4 Drawing Sheets

# METHOD AND APPARATUS FOR PREDICTING BATTERY RESERVE TIME TO A SPECIFIED END-VOLTAGE

FIELD OF THE INVENTION

This invention relates to battery capacity prediction and in particular to a method and apparatus for predicting the remaining reserve time of a battery until a specified end voltage is attained.

BACKGROUND OF THE INVENTION

Prediction of the remaining reserve time of a discharging battery is very desirable information in situations where a critical process is dependent upon the battery capacity. Such a prediction may require the monitoring of a condition of a battery and an extrapolation therefrom to determine the life of the battery in which it may be depended upon to power the critical process.

There are many approaches to battery capacity prediction. In one approach (U.S. Pat. No. 4,952,862) reserve time is predicted based on the measured discharge characteristics of a battery. The discharge is characterized by a discharge curve with a linear and exponential region and by a measured plateau voltage. These characterizations combined with a real time monitoring of dynamic parameter of the battery allows a running prediction of remaining battery reserve time with continuously improving accuracy. This system however is highly dependent upon an ideal discharge profile and many batteries diverge significantly from this ideal profile.

In another approach (U.S. Pat. No. 4,876,513) the battery voltage is compensated for resistive voltage drop and continuously compared with the allowable end voltage to provide a compensated voltage level from which the remaining battery capacity is calculated. The approach is also highly dependent upon the ideal discharge profile of the battery.

SUMMARY OF THE INVENTION

A reserve time predictive system for predicting the capacity of a discharging battery monitors the instant voltage of a battery, its discharge rate and a slope of the voltage vs ampere-hours removed from the battery. The slope of the discharge profile of battery voltage vs amphere-hours removed, and the difference between the present and end voltage is utilized to determine a prediction of reserve time remaining until the battery discharges to the specified end voltage. A combination of remaining reserve time and the measurement of capacity removed also determines the available capacity of the battery from a fully charged state. This information is used as historical data for use in subsequent predictions of battery capacity.

DETAILED DESCRIPTION

Figure 1:
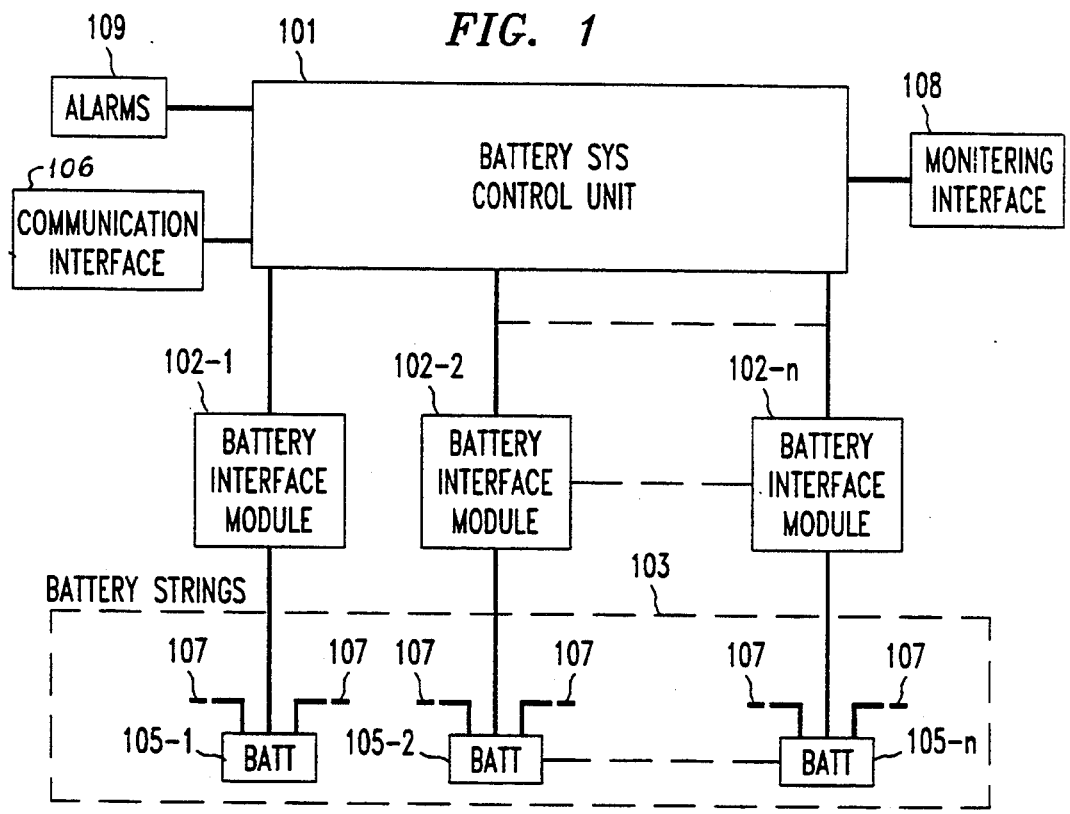
FIG. 1 is a block schematic of a battery monitoring and control system.

The battery monitoring and control system, shown in FIG. 1, includes a battery system control unit 101 which includes a stored program control to monitor and evaluate data collected from the battery cells or strings 105-$n$ under its control or cognizance. This cognizance is particularly concerned with battery maintenance and especially battery maintenance of batteries located at remote sites where no maintenance personnel are readily available. In particular, the monitoring is directed to predicting how long it will be before the discharging battery is in jeopardy of failure. This facilitates a sensible response by the maintenance personnel in maintaining the operation of the battery plant and helps evaluate the remaining capacity and needs for battery replacement.

The battery system control unit 10 1 is connected to a plurality battery interface modules 102-$n$ all of which include sensing devices to monitor battery supply currents, battery voltages, battery temperature and other variables of the battery cells or strings 105-$n$. These cells or strings may be combined into a battery plant 103 serving some remote activity such as a telecommunications office.

The battery system control in response to measured parameters of the battery determines its expected reserve time during its discharge to predict the reserve time to a specified end voltage. Under the battery system control these predictions are periodically updated. The predicted times are advantageously weighted to underestimate remaining reserve time.

Connecting leads 107 are shown which interconnect the batteries to apparatus to be energized. Since this aspect of the battery system is conventional no detailed description is provided. The nature of such arrangements will be readily apparent to those skilled in the art.

The battery system control unit includes a connecting communication interface 106 to facilitate the readout of data. A monitoring interface 108 is included to provide local data readout and input and an alarm 109 responds to emergency conditions.

Figure 2:
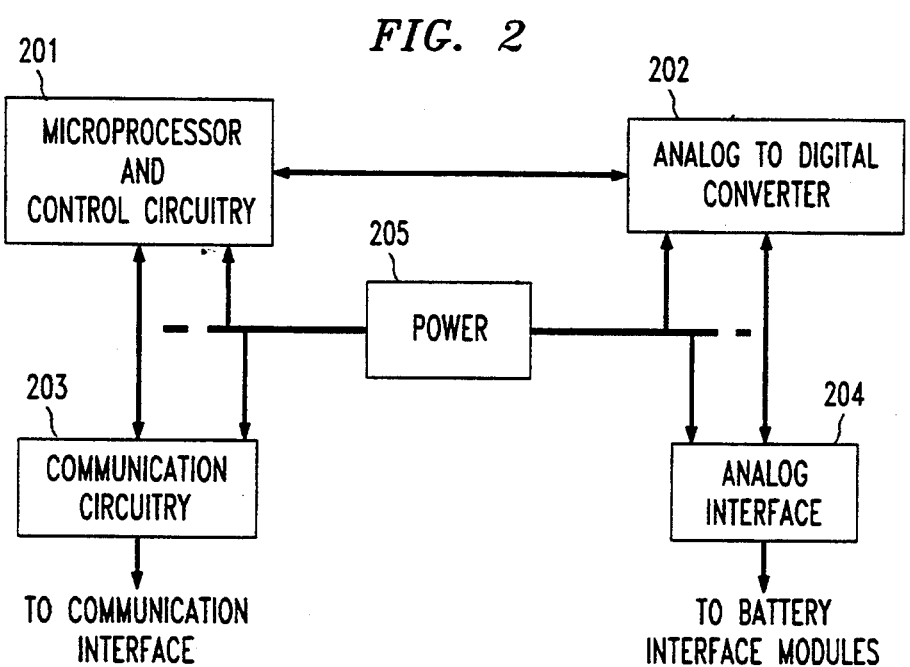
FIG. 2 is a block schematic of the central control unit of the system of FIG. 1.

The battery system control unit is shown in FIG. 2. It includes a microprocessor and control circuit 201, an analog to digital converter 202, communication circuitry 203 and an analog interface 204. A power circuit 205 is provided to energize these units. The microprocessor and control circuit 201 includes the processor, busses interfaces and memory devices including stored programs which are utilized to perform the designated control functions. Circuit 201 is connected to the communication circuitry to enable communication with the communication interface 106 and the monitoring interface shown in the FIG. 1. Circuit 201 is also connected to the analog to digital converter 202 which is connected to connect the circuit 201 to the analog interface which is in turn connected to the battery interface modules 102-$n$ shown in the FIG. 1.

Figure 3:
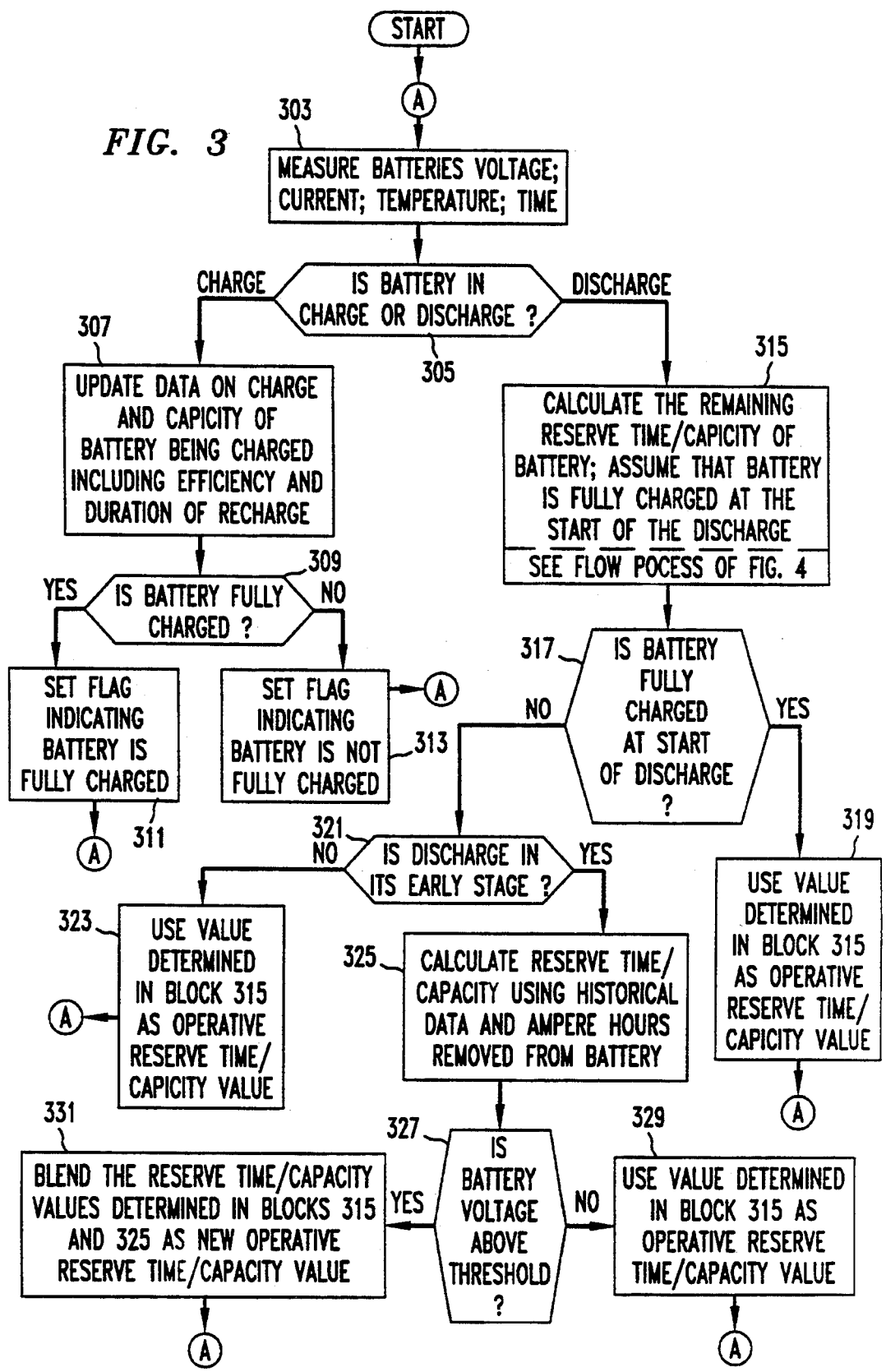
FIGS. 3 and 4 disclose a flow process diagram of a stored program control used to monitor battery states and predict battery reserve time/capacity.
Figure 4:
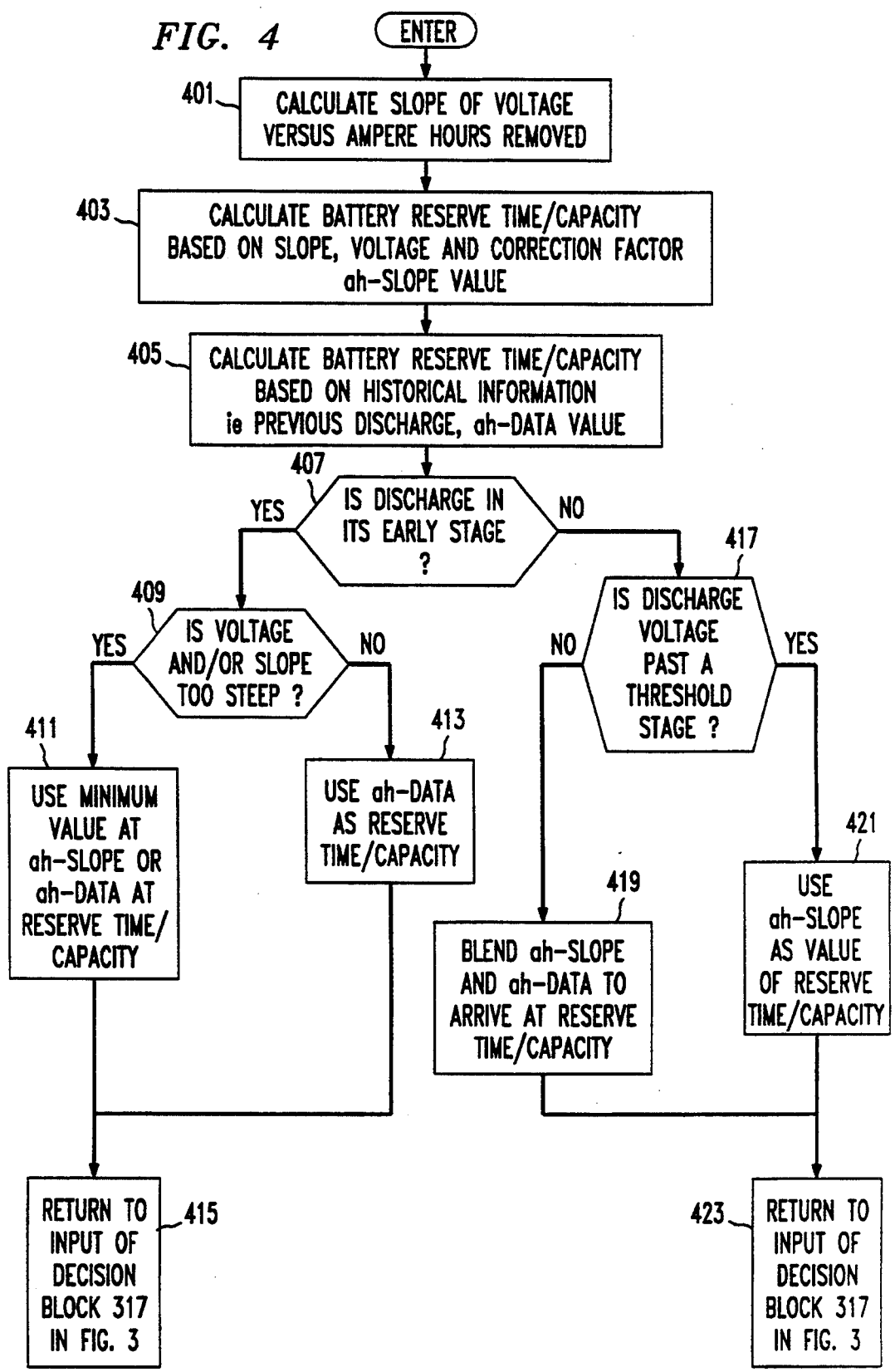

The process for determining the remaining reserve time/capacity is shown by the process shown in the flow charts of FIGS. 3 and 4. The process for a particular battery cell or string begins in FIG. 3 box 303 in which instructions cause the voltage, current charge or discharge and battery temperature are measured and stored for evaluation in the control unit. A subsequent evaluation in the decision block 305 determines if the battery presently being reviewed is in a state of being charged or in a state of being discharged.

In the instance of the battery being charged, the flow process proceeds to the instruction block 307 which provides for acquisition and storage of data relating to the charge state, capacity and recharging data related to the battery. The subsequent decision block 309 determines if the battery is fully charged. If it is, a flag is set, as per the instructions of block 311, in the memory of the controller to provide an indication that this battery is fully charged. If it is not fully charged, the instructions of block 313 set another flag to provide an indication in memory that the battery is not fully charged. The flow process now returns to the start of the process at the input terminal A.

At the decision block 305, a determination that the battery being reviewed is discharging causes the flow process to proceed to the instruction block 315, which is operative to calculate a remaining reserve time/capacity of the battery. This calculation is performed as if the battery is fully charged and/or at the start of a discharge. The process of determining this reserve time/capacity value is shown by the flow diagram of FIG. 4, which is discussed in detail herein below.

The state of the discharging battery as being fully charged at the start of the discharge is determined by the decision block 317. With the battery being ascertained as being fully charged the reserve time/capacity determined in block 315 is utilized as the operative reserve time/capacity value in block 319 and is returned as the readout value. The flow process proceeds to the terminal A.

If the discharging battery was not fully charged at the start of discharge, the flow process proceeds to the decision block 321 which evaluates the stage of the discharge of the battery. Since the method of determining reserve time is dependent on the slope of the discharge curve the evaluation of discharge at an early stage is limited by small slope. If the discharge curve represents a late stage of discharge the results determined in the block 315 are acceptable and the result is communicated as the relevant reserve time/capacity value as instructed by block 323 and the flow process returns to terminal A.

If the discharge is at an early stage where the discharge curve has a small slope, the process flow proceeds to the instruction block 325 where the remaining reserve time/capacity is determined by previous historical data concerning previous battery performance and the amount of ampere-hours removed from the battery in the present discharge cycle. A subsequent decision block 327 evaluates if the battery voltage exceeds a voltage threshold at which the slope of the discharge curve is expected to be shallow. If the voltage is below the threshold the reserve time/capacity determined in block 315 is utilized as the operative reserve time/capacity value.

If the voltage is above the threshold value, in accord with the instructions of block 331, the value of remaining reserve time/capacity is chosen as a blend of values which have been determined in the instruction blocks 315 and 325. This value is chosen as the operative reserve time/capacity value. The blend is chosen from past experience from the period of discharge and the duration of the present discharge.

Figure 5:
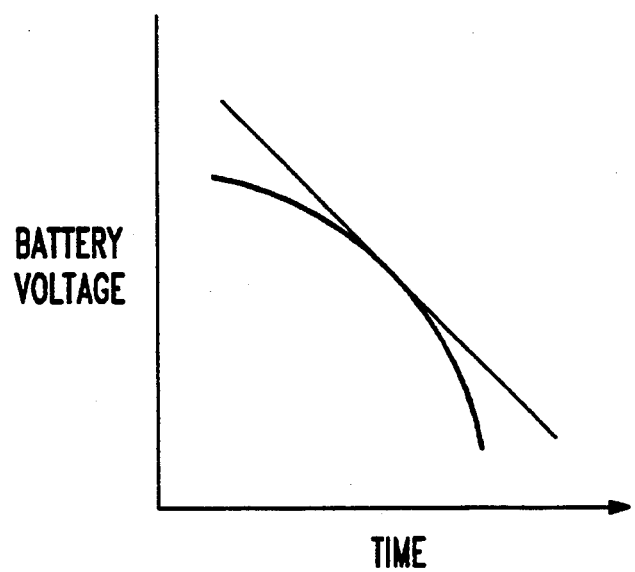
FIG. 5 is a graph of a typical discharge curve profile.

A typical discharge curve is shown in FIG. 5. A characteristic of the discharge curve profile is that is has a convex profile as viewed top down and hence the slope of the discharge curve becomes steeper as the duration of discharge time increases. The operative equation in determining the remaining reserve time/capacity is the relation:

$$ah = (\delta V/\text{slope}) * \alpha \tag{1}$$

The ampere hours ah of remaining capacity is directly proportional to the difference $\delta V$ between the present battery voltage and a specified end voltage divided by the slope of the discharge curve. This ratio is related to the ampere hours of capacity remaining by the correction factor $\alpha$ (alpha) which must be determined for each individual battery type. Alpha ($\alpha$) a value stored in a matrix in memory of the controller. It has different values for various combinations of voltage level and discharge current of the battery. These values are determined from statistical analysis of the discharge performance of multiple batteries of the same type tested at various discharge rates.

It has been determined that the profile of the discharge curve provides a relatively constant relation ship between the remaining ampere hours of capacity and the ratio of voltage difference between the present voltage and the specified end voltage. Evaluation of this slope allows a precise estimate to be made of remaining battery reserve time.

The process of block 315 for predicting the reserve time/capacity of a fully charged discharging battery is shown in the FIG. 4. The initial instruction block 401 is operative to calculate the slope of the discharge curve from a plurality of recently obtained and stored data points representing voltage versus ampere hours removed. These values are used in the instruction block to calculate a reserve time/capacity using the equation (1) to determine a value in ampere hours. This value is designated as the ah-slope value. A subsequent instruction block 405 calculates a reserve time/capacity using historical data from the previous charge and discharge activity of the battery. This value is designated as the ah-data value.

An evaluation by decision block 407 determines if the discharge cycle of the battery is in an early stage. At an early stage the slope of the discharge curve may be too shallow to permit accurate use of a slope measurement to determine reserve time/capacity. Hence when an early stage discharger is detected the decision block 409 determines if the slope is too steep for that stage of discharge. If it is the minimum value of reserve time calculated from slope ah-slope and from historical data ah-data is used as the probable reserve time in accord with the inspections of block 411.

If the slope is not very steep the historical data is used to determine the remaining reserve time/capacity as per the instructions of block 413. After the blocks 411 and 413 the flow process returns to the input to decision block 317 shown in FIG. 3.

If decision block 407 determines that the discharge is beyond an early stage, the subsequent decision block 417 evaluates if the discharge voltage of the discharging battery has dropped below some threshold value or stage. Such a value may be a drop of 30% of the capacity removed from the battery.

If the voltage has not dropped below the threshold value, a blend of historical data ah-data and slope evaluation·ah-slope is used, in instruction block 419 to evaluate the reserve time/capacity of the battery. If the battery voltage is below the threshold stage the instructions of block 421 use ah-slope to evaluate the remaining reserve time/capacity of the battery. The instructions of block 423 return the flow process to the input of decision block 317 in FIG. 3.

It is claimed:

1. A method for predicting a battery reserve time to a specified end voltage embedded in a battery monitoring system including a microprocessor and control circuit, interface circuitry interconnecting the microprocessor and control circuit to the batteries being monitored and including means for sensing battery currents and voltages; and the batteries being monitored having a discharge curve with a top down convexity;

the method including the steps of:
periodically measuring a voltage, current of a battery at sequential time intervals;
identifying from the plurality of voltage and current measurements if the battery is discharging;
calculating a slope of the battery discharge characteristic, by determining the slope of the curve represented the plurality of voltage and current measurements and time defining a voltage versus ampere-hours removed;
preparing a matrix of correction factors $\alpha$ based on discharge performance of the battery relating for various combinations of voltage level and discharge current of the battery;
calculating a first remaining reserve time/capacity using the slope, the correction factor for existing voltage and discharge level and a voltage value $\delta V$ representing a difference between present battery voltage and a specified end voltage according to the relation $$ah = (\delta V/\text{slope})^* \alpha$$

determining if the battery was fully charged at the start of discharge; and
using the first remaining reserve time/capacity as the suitable value of reserve time/capacity if the battery was fully charged at the start of discharge.

2. A method for predicting a battery reserve time to a specified end voltage as claimed in claim 1;
further including the step of:
calculating the first remaining reserve time/capacity including determining if the battery discharge is in an early stage of discharge, and if the battery was not fully charged at the start of discharge; and
if discharge is at an early stage and if the discharge curve slope is unsteep/shallow determining a second value of reserve time/capacity based on stored historical data and selecting a minimum value from the value of reserve time/capacity based on stored historical data and ampere hours removed from the battery.

3. A method for predicting a battery reserve time to a specified end voltage as claimed in claim 2;
further including the step of:
determining if the battery discharge is beyond an early stage of discharge, and
if the battery discharge is beyond an early stage of discharge further determining if the discharge is less than a drop of 30% of the capacity removed from the battery and deriving a third reserve time/capacity as a a blend of values of the first and second values of reserve time/capacity as the selected reserve time/capacity.

4. A method for predicting a battery reserve time to a specified end voltage as claimed in claim 3;
further including the step of:
in accord with the step of determining if the battery discharge is beyond an early stage of discharge and exceeding a threshold value, and using the slope of the curve for determining the reserve time/capacity.

5. A method for predicting a battery reserve time to a specified end voltage as claimed in claim 3;
further including the step of:
comparing the voltage of the battery when discharging with a threshold and using the first remaining reserve time/capacity as the selected reserve time/capacity.

6. A method for predicting a battery reserve time to a specified end voltage embedded in a battery monitoring system including a microprocessor and control circuit, interface circuitry interconnecting the microprocessor and control circuit to the batteries being monitored and including means for sensing battery currents and voltages; and the batteries being monitored having a discharge curve with a top down convexity;

the method including the steps of:
periodically measuring a voltage, current of a battery at sequential time intervals;
identifying from the plurality of voltage and current measurements if the battery is discharging;
calculating a slope of the battery discharge characteristic, by determining the slope of the curve representing the plurality of voltage and current measurements and time defining a voltage versus ampere-hours removed;
preparing a matrix of correction factors $\alpha$ based on discharge performance of the battery relating for various combinations of voltage level and discharge current of the battery;
calculating a first remaining reserve time/capacity using the slope, the correction factor for existing voltage and discharge level and a voltage value $\delta V$ representing a difference between present battery voltage and a specified end voltage according to the relation $$ah = (\delta V/\text{slope})^* \alpha$$

determining a time stage early/beyond early at which the battery is discharging;
determining if the battery was fully charged at the start of the discharge; and
if discharge is at an early stage and if the discharge curve slope is not too steep predicting reserve time remaining by calculating a first value of remaining time based on existing ah data;
if discharge is at an early stage and if the discharge curve slope is too steep determining a second value of remaining reserve time/capacity based on a minimum value of the ah slope;
if the battery discharge is beyond an early stage of discharge further determining if the discharge is less than a drop of 30% of the capacity removed from the battery and calculating a third remaining reserve time/capacity as a blend of values of the first and second values of reserve time/capacity as the selected reserve time/capacity.

* * * * *